US010976356B2

(12) United States Patent
Oda et al.

(10) Patent No.: US 10,976,356 B2
(45) Date of Patent: Apr. 13, 2021

(54) VOLTAGE DETECTOR AND SIGNAL OUTPUT DEVICE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Kota Oda, Mie (JP); Yuki Sugisawa, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/621,459

(22) PCT Filed: Jun. 1, 2018

(86) PCT No.: PCT/JP2018/021147
§ 371 (c)(1),
(2) Date: Dec. 11, 2019

(87) PCT Pub. No.: WO2018/235562
PCT Pub. Date: Dec. 27, 2018

(65) Prior Publication Data
US 2020/0174047 A1 Jun. 4, 2020

(30) Foreign Application Priority Data

Jun. 22, 2017 (JP) .............................. JP2017-122468

(51) Int. Cl.
*H03K 5/153* (2006.01)
*G01R 19/165* (2006.01)
*H03K 5/156* (2006.01)

(52) U.S. Cl.
CPC ..... *G01R 19/16504* (2013.01); *H03K 5/1565* (2013.01)

(58) Field of Classification Search
CPC .... H03K 5/153; H03K 5/1534; H03K 5/1565; H03K 5/08; H03K 5/24; H03K 5/2481;
(Continued)

(56) References Cited

U.S. PATENT DOCUMENTS

2018/0358806 A1* 12/2018 Mase ..................... H03K 17/18
2019/0260200 A1* 8/2019 Sawano ............... H02H 7/1213

FOREIGN PATENT DOCUMENTS

JP 2000-277174 A 10/2000
JP 2007-214905 A 8/2007
(Continued)

OTHER PUBLICATIONS

International Search Report, Application No. PCT/JP2018/021147, dated Aug. 28, 2018. ISA/Japan Patent Office.

*Primary Examiner* — Long Nguyen
(74) *Attorney, Agent, or Firm* — Honigman LLP

(57) ABSTRACT

A voltage detector detects a voltage of a positive electrode of a battery, and outputs a detection value indicating a detected voltage value. A target voltage to be detected is applied to one end of a resistor, via a first switch. A current is input to an output circuit from the other end of the resistor. The output circuit outputs a current whose current value substantively coincides with the current value of the current input from the resistor to one end of a resistor, while maintaining a voltage value of the other end of the resistor substantively at a predetermined voltage value. A voltage value of the one end of the resistor is output to a microcomputer as the detection value.

8 Claims, 6 Drawing Sheets

(58) Field of Classification Search
CPC .... H03K 5/249; H03K 3/02337; H03K 17/58; G01R 1/28; G01R 19/16519; G01R 19/16504
See application file for complete search history.

(56) References Cited

FOREIGN PATENT DOCUMENTS

JP        2008-064645 A     3/2008
JP        2015-114204 A     6/2015

\* cited by examiner

US 10,976,356 B2

VOLTAGE DETECTOR AND SIGNAL OUTPUT DEVICE

CROSS-REFERENCE TO RELATED APPLICATIONS

This application is the U.S. national stage of PCT/JP2018/021147 filed on Jun. 1, 2018, which claims priority of Japanese Patent Application No. JP 2017-122468 filed on Jun. 22, 2017, the contents of which are incorporated herein.

TECHNICAL FIELD

The present disclosure relates to a voltage detector and a signal output device.

BACKGROUND

JP 2015-114204A discloses a voltage detector that detects voltage. This voltage detector has two resistors, with a target voltage to be detected being applied to one end of one resistor, the other end of the one resistor being connected to one end of the other resistor, and the other end of the other resistor being grounded.

The two resistors divide the target voltage being applied to one end of one resistor, and output the voltage value of the divided voltage to an A/D (Analog/Digital) conversion unit as an analog detection value. At this time, the analog detection value is a voltage value calculated by dividing the voltage value of the target voltage by a predetermined number.

The A/D conversion unit converts the input analog detection value into a digital detection value. Various types of processing are executed based on the digital detection value obtained through conversion by the A/D conversion unit.

In a conventional voltage detector such as disclosed in JP 2015-114204A, an input range of detection values that can be input to the A/D conversion unit is set in advance. The A/D conversion unit selects one of N digital voltage values belonging to the input range as a digital detection value, based on the input analog detection value. The analog detection value is thereby converted into a digital detection value. N is an integer of two or more. The N digital voltage values are set at equal intervals in the input range. For example, in the case where the input range is from 0 V to 5 V, the width of one scale is represented by 5/(N−1). The A/D conversion unit selects the digital voltage value closest to the input analog detection value, for example, as the digital detection value.

Assume that, in the conventional voltage detector, the upper limit of a fluctuation range related to the voltage value of the target voltage is 25 V, and the input range is from 0 V to 5 V. At this time, with the conventional voltage detector, the two resistors output a voltage value that is calculated by dividing the voltage value of the target voltage by 5, for example, as the analog detection value, such that the analog detection value takes a value in the input range.

In this case, the range of analog detection values that are output is from 0 V to 5 V, and is included in the input range. The voltage value of the target voltage is calculated, by multiplying the digital detection value obtained through conversion by the A/D conversion unit by 5. In many cases, the analog detection value and the digital detection value do not perfectly coincide, and an error exists between the analog detection value and the digital detection value.

In the case where an error exists between the analog detection value and the digital detection value, an error also exists between the calculated voltage value of the target voltage and the actual voltage value of the target voltage. The maximum value of the error related to the voltage value of the target voltage is calculated by converting the width of one scale related to the digital detection value into the width of the voltage value related to detection of the target voltage, and is 25/(N−1). The maximum value of the error is a resolution related to voltage detection.

In the configuration that divides the target voltage, the lower limit of the voltage detection range is 0 V, even when the fluctuation range of the voltage value of the target voltage is from 5 V to 25 V. Because the upper limit of the voltage detection range must be set to a voltage value that is greater than or equal to the upper limit of the fluctuation range of the voltage value of the target voltage, the minimum value of the resolution related to voltage detection is calculated by dividing the upper limit of the fluctuation range of the voltage value of the target voltage by (N−1). Accordingly, there is a problem in that, in the configuration that divides the target voltage, the resolution related to voltage detection is large.

In view of this, an object of the disclosure is to provide a voltage detector that is able to adjust the lower limit of the target voltage detection range to a voltage value exceeding 0 V, and a signal output device provided with this voltage detector.

SUMMARY

A voltage detector according to one mode of the present disclosure is a voltage detector for detecting a voltage and outputting a detection value indicating a detected voltage value, including a first resistor to which a target voltage to be detected is applied at one end, an output circuit to which a current is input from an other end of the first resistor, and configured to output a current whose current value coincides with a current value of the current input from the other end of the first resistor, and a second resistor to which the current output by the output circuit is input at one end, the output circuit maintaining the voltage value of the other end of the first resistor at a predetermined voltage value, and outputting a voltage value of the one end of the second resistor as the detection value.

A signal output device according to one mode of the present disclosure includes the aforementioned voltage detector, an output unit configured to output a PWM signal, and an adjustment unit configured to adjust a duty of the PWM signal that is output by the output unit, according to the detection value output by the voltage detector.

Advantageous Effects of Disclosure

According to this disclosure, the lower limit of the target voltage detection range can be adjusted to a voltage value exceeding 0 V.

DETAILED DESCRIPTION OF PREFERRED EMBODIMENTS

Figure 1:
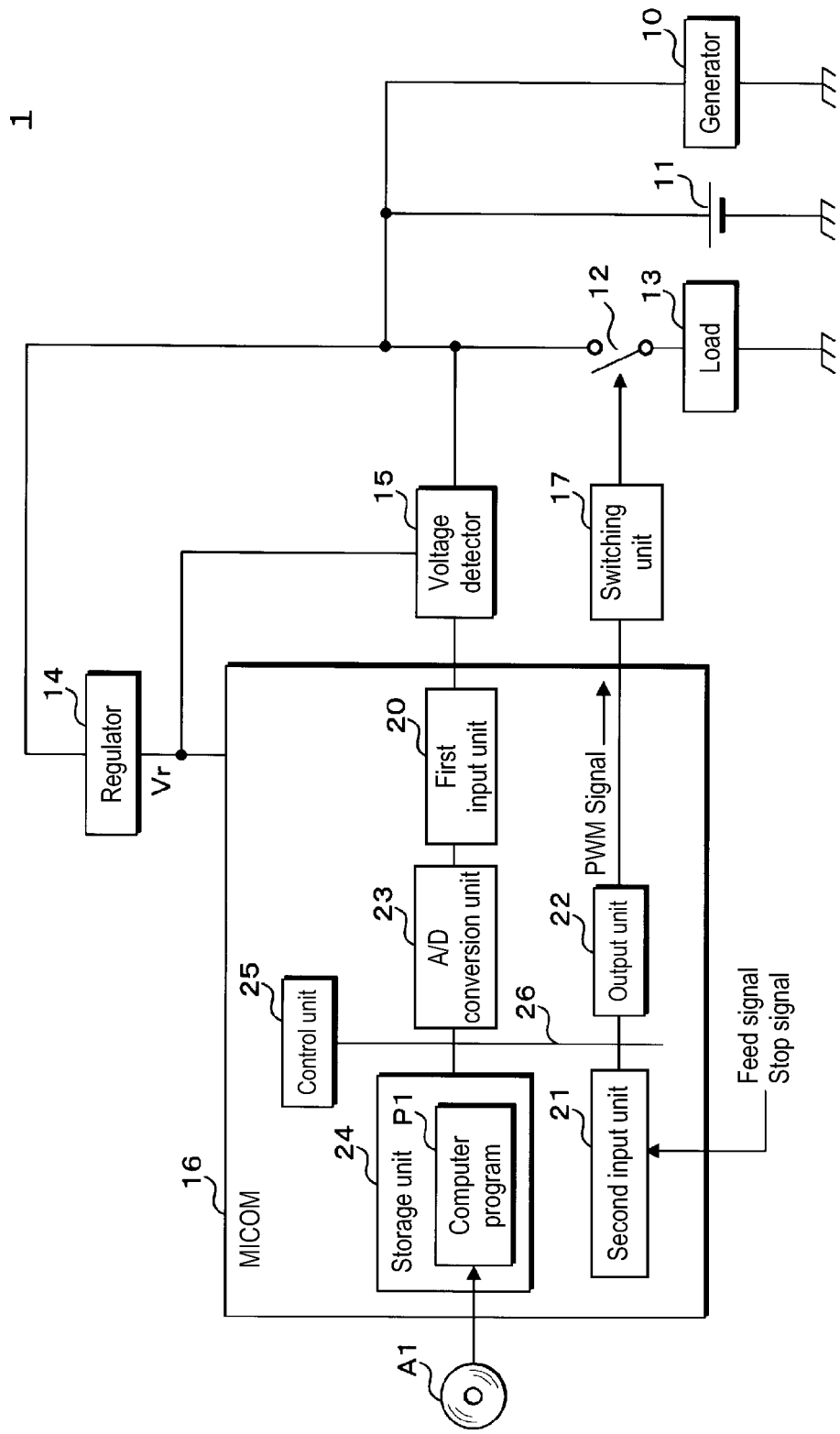
FIG. 1 is a block diagram showing the configuration of a main section of a power supply system in a first embodiment.

Initially modes for carrying out the disclosure will be cited and described. At least some of the embodiments described below may be combined in any given manner.

A voltage detector according to one mode of the present disclosure is a voltage detector for detecting a voltage and outputting a detection value indicating a detected voltage value, including a first resistor to which a target voltage to be detected is applied at one end, an output circuit to which a current is input from an other end of the first resistor, and configured to output a current whose current value coincides with a current value of the current input from the other end of the first resistor, and a second resistor to which the current output by the output circuit is input at one end, the output circuit maintaining the voltage value of the other end of the first resistor at a predetermined voltage value, and outputting a voltage value of the one end of the second resistor as the detection value.

In the above mode, because the other end of the first resistor is maintained at a predetermined voltage value, the current value that is input from the first resistor is represented by ((voltage value of target voltage)−(predetermined voltage value))/(resistance value of first resistor). The voltage value of the one end of the second resistor is output as the detection value. The current value of the current that is input to the output circuit from the other end of the first resistor coincides with the current value of the current that is input to the one end of the second resistor from the output circuit. Thus, in the case where the other end of the second resistor is grounded, the detection value is represented by ((voltage value of target voltage)−(predetermined voltage value))−(resistance value of second resistor)/(resistance value of first resistor). "·" represents a product operation.

When the voltage value of the target voltage is less than the predetermined voltage value, the voltage value of the target voltage is not detected. When the voltage value of the target voltage is the predetermined voltage value, the detection value is 0 V. When the voltage value of the target voltage is greater than or equal to the predetermined voltage value, the detection value increases with an increase in the voltage value of the target voltage. By adjusting the predetermined voltage value to a voltage value exceeding 0 V, it is possible to adjust the lower limit of the target voltage detection range to a voltage value exceeding 0 V.

In the voltage detector according to one mode of the present disclosure, the output circuit includes a PNP first bipolar transistor whose emitter is connected to the other end of the first resistor, and whose collector is connected to the one end of the second resistor, an NPN second bipolar transistor to which a base of the first bipolar transistor is connected at an emitter, and to which a second predetermined voltage is applied at a base, and a third resistor whose one end is connected to the emitter of the second bipolar transistor, and the base of the second bipolar transistor is connected to a collector of the second bipolar transistor.

In the above mode, current flows in order of the emitter and base of the first bipolar transistor and the third resistor, and flows in order of the base and emitter of the second bipolar transistor and the third resistor. The difference value that is calculated by subtracting the voltage value between the emitter and base of the second bipolar transistor from the voltage value between the emitter and base of the first bipolar transistor is assumed to be substantially 0 V or substantially constant, regardless of the current value of the current that flows to the third resistor. Here, the voltage value between the base and emitter of the first bipolar transistor is the voltage value of the emitter based on the potential of the base, and the voltage value between the emitter and base of the second bipolar transistor is the voltage value of the base based on the potential of the emitter.

In the output circuit, the voltage value of the other end of the first resistor is calculated by adding the difference value to the voltage value of a second predetermined voltage. Here, because the difference value is substantially 0 V or substantially constant, the voltage value of the other end of the first resistor is maintained substantively at a constant value. In the first bipolar transistor, substantially all of the current input from the other end of the first resistor to the emitter is output to the one end of the second resistor from the collector. Thus, the current value of the current that is input from the other end of the first resistor substantively coincides with the current value of the current that is output to the one end of the second resistor.

In the voltage detector according to one mode of the present disclosure, the output circuit includes a PNP bipolar transistor whose emitter is connected to the other end of the first resistor, and whose collector is connected to the one end of the second resistor, a diode to which a base of the bipolar transistor is connected at a cathode, and to which a second predetermined voltage is applied at an anode, and a third resistor whose one end is connected to the cathode of the diode.

In the above mode, current flows in order of the emitter and base of the bipolar transistor and the third resistor, and flows in order of the diode and the third resistor. The difference value that is calculated by subtracting the forward voltage value of the diode from the voltage value between the base and emitter of the bipolar transistor is assumed to be substantially 0 V or substantially constant, regardless of the current value of the current that flows to the third resistor flows. Here, the voltage value between the base and emitter of the bipolar transistor is the voltage value of the emitter based on the potential of the base.

In the output circuit, the voltage value of the other end of the first resistor is calculated by adding the difference value to the voltage value of the second predetermined voltage. Here, since the difference value is substantially 0 V or substantially constant, the voltage value of the other end of the first resistor is maintained substantively at a constant value. In the bipolar transistor, substantially all of the current that is input to the emitter from the other end of the first resistor is output from the collector to the one end of the second resistor. Thus, the current value of the current that is input from the other end of the first resistor substantially coincides with the current value of the current that is output to the one end of the second resistor.

The voltage detector according to one mode of the present disclosure includes a switch whose one end is connected to the one end of the first resistor, the target voltage being applied to the one end of the first resistor via the switch, and the switch being ON when the second predetermined voltage is being applied, and being OFF when the second predetermined voltage has stopped being applied.

In the above mode, in the case where the second predetermined voltage has stopped being applied, the switch is OFF and current does not flow through the first resistor and the second resistor. Thus, the power that is consumed by the first resistor and the second resistor is suppressed.

A signal output device according to one mode of the present disclosure includes the aforementioned voltage detector, an output unit configured to output a PWM signal, and an adjustment unit configured to adjust a duty of the PWM signal that is output by the output unit, according to the detection value output by the voltage detector.

In the above mode, the duty of a PWM (Pulse Width Modulation) signal is adjusted according to the detection value output by the voltage detector.

Specific examples of a power supply system according to embodiments of the present disclosure will be described below with reference to the drawings. It should be noted that the disclosure is not limited to these illustrative examples and is indicated by the claims, and all changes that come within the meaning and range of equivalency of the claims are intended to be embraced therein.

First Embodiment

FIG. 1 is a block diagram showing the configuration of a main section of a power supply system 1 in a first embodiment. The power supply system 1 is favorably installed in a vehicle, and is provided with a generator 10, a battery 11, a feed switch 12, a load 13, a regulator 14, a voltage detector 15, a microcomputer (hereinafter, MICOM) 16, and a switching unit 17. The regulator 14 has an input end and an output end.

One end of the generator 10 and a positive electrode of the battery 11 are connected to one end of the feed switch 12. The other end of the feed switch 12 is connected to one end of the load 13. The other end of the generator 10, a negative electrode of the battery 11 and the other end of the load 13 are grounded. The input end of the regulator 14 and the voltage detector 15 are further connected to the one end of the feed switch 12. The output end of the regulator 14 is connected to the voltage detector 15 and the MICOM 16. The voltage detector 15 is further connected to the MICOM 16. The switching unit 17 is also connected to the MICOM 16.

The generator 10 generates AC (alternating current) power in conjunction with an engine (not shown) of the vehicle. The generator 10 rectifies the generated AC power into DC (direct current) power, and outputs a DC voltage related to the rectified DC power. When the engine has stopped operating, the generator 10 also stops operating.

When the generator 10 is operating, the generator 10 feeds power to the battery 11. The battery 11 is thereby charged.

If the feed switch 12 is ON when the generator 10 is operating, the generator 10 feeds power to the load 13 in addition to the battery 11.

If the feed switch 12 is ON when the generator 10 has stopped operating, the battery 11 feeds power to the load 13.

When the feed switch 12 is OFF, power is not fed to the load 13.

A feed signal instructing to feed power to the load 13 and a stop signal instructing to stop feeding power to the load 13 are input to the MICOM 16 from a device (not shown).

The MICOM 16 outputs a PWM signal to the switching unit 17 when the feed signal is input. The switching unit 17 alternately switches the feed switch 12 to ON and OFF, while the PWM signal is being input from the MICOM 16. Power is thereby fed from the generator 10 or the battery 11 to the load 13, via the feed switch 12, and the load 13 operates.

The load 13 is an electrical device installed in the vehicle, such as an incandescent lamp, for example.

The switching unit 17 periodically performs switching of the feed switch 12 from OFF to ON or switching of the feed switch 12 from ON to OFF, in accordance with the PWM signal input from the MICOM 16.

The performance of the load 13 is dependent on the voltage value of the voltage that is applied to the load 13 and a switching duty related to switching of the feed switch 12 to ON and OFF. The switching duty is the percentage of one cycle occupied by the period for which the feed switch 12 is ON, and is adjusted to a value exceeding 0 and less than 1.

The load 13 is assumed to be an incandescent lamp. The intensity of light that is emitted by an incandescent lamp is dependent on the average value of power that is fed to the incandescent lamp. The intensity of light that is emitted by an incandescent lamp is greater as the average value of power over a fixed period is greater. The power value of power that is fed to an incandescent lamp is greater as the voltage value of the voltage that is applied to the incandescent lamp is higher. Accordingly, the intensity of the light that is emitted by an incandescent lamp is greater as the voltage value of the voltage that is applied to the incandescent lamp is higher, and is greater as the switching duty is greater.

The MICOM 16 stops outputting the PWM signal to the switching unit 17 when the stop signal is input. When output of the PWM signal to the switching unit 17 stops, the switching unit 17 switches the feed switch 12 to OFF, and maintains the feed switch 12 at OFF until the PWM signal is input. When the feed switch 12 is OFF, power is not fed to the load 13, and the load 13 stops operating, as aforementioned.

The PWM signal is constituted by a high level voltage and a low level voltage. When the voltage shown by the PWM signal switches from the low level voltage to the high level voltage, the switching unit 17 switches the feed switch 12 from OFF to ON. When the voltage shown by the PWM signal switches from the high level voltage to the low level voltage, the switching unit 17 switches the feed switch 12 from ON to OFF.

With the PWM signal, switching from the low level voltage to the high level voltage or switching from the high level voltage to the low level voltage is performed periodically. A signal duty related to the PWM signal is the percentage of one cycle occupied by the period for which the PWM signal indicates the high level voltage, and is adjusted to a value exceeding 0 and less than 1.

=When the PWM signal indicates the high level voltage, the feed switch 12 is ON, and when the PWM signal indicates the low level voltage, the feed switch 12 is OFF. Thus, the signal duty coincides with the switching duty. The MICOM 16 adjusts the switching duty by adjusting the signal duty.

When the generator 10 is operating, the voltage output by the generator 10 is input to the input end of the regulator 14. When the generator 10 has stopped operating, a voltage is input to the input end of the regulator 14 from the battery 11. The regulator 14 generates a predetermined voltage whose voltage value is a reference voltage value Vr, using the voltage being input to the input end, and outputs the predetermined voltage that is generated to the voltage detector 15 and the MICOM 16 from the output end. The reference voltage value Vr is a fixed value, and is set in advance.

When the regulator 14 is outputting the predetermined voltage from the output end, the voltage detector 15 detects the voltage and the MICOM 16 operates. When the regulator 14 has stopped outputting a voltage, the voltage detector 15 does not detect a voltage and the MICOM 16 stops operating.

The regulator 14 operates when an ignition switch of the vehicle switches from OFF to ON, and stops operating when the ignition switch switches from ON to OFF, for example.

In relation to the voltage detector 15, the target voltage to be detected is the voltage of the positive electrode of the battery 11 based on ground potential. The voltage detector 15 detects the target voltage and outputs an analog detection value indicating the voltage value of the target voltage to the MICOM 16. The input range of detection values that can be input to the MICOM 16 is set in advance, and is from 0 V to the reference voltage value Vr, for example. The voltage value of the target voltage corresponds to the voltage value detected by the voltage detector 15.

The MICOM 16 has a first input unit 20, a second input unit 21, an output unit 22, an A/D conversion unit 23, a storage unit 24, and a control unit 25. The second input unit 21, the output unit 22, the A/D conversion unit 23, the storage unit 24 and the control unit 25 are connected to a bus 26. The A/D conversion unit 23 is connected to the first input unit 20, apart from the bus 26. The first input unit 20 is further connected to the voltage detector 15. The output unit 22 is connected to the switching unit 17, apart from the bus 26.

The analog detection value is input to the first input unit 20 from the voltage detector 15. The first input unit 20 outputs the analog detection value input from the voltage detector 15 to the A/D conversion unit 23.

The A/D conversion unit 23 converts the analog detection value input from the first input unit 20 into a digital detection value. In the input range, N digital voltage values are set at equal intervals. N is an integer of two or more. For example, in the case where the input range is from 0 V to the reference voltage value Vr, the width of one scale is Vr/(N−1). In the case where the digital detection value is represented by K-bit data, N is 2 to the power of K, for example. K is a natural number.

The A/D conversion unit 23 selects one of the N digital voltage values as the digital detection value, based on the analog detection value input from the first input unit 20. As an example, the A/D conversion unit 23 selects the digital voltage value closest to the analog detection value input from the first input unit 20 as the digital detection value, from among the N digital voltage values, by rounding off. As another example, the A/D conversion unit 23 selects the first closest or second closest digital voltage value to the analog detection value input from the first input unit 20 as the digital detection value, from among the N digital voltage values, by rounding down.

The control unit 25 acquires the digital detection value obtained through conversion by the A/D conversion unit 23 from the A/D conversion unit 23. The voltage value indicated by the detection value acquired by the control unit 25 substantially coincides with the voltage value of the target voltage at the point of acquisition.

The feed signal and the stop signal are input to the second input unit 21 from a device (not shown). The second input unit 21 notifies the input signal to the control unit 25, when the feed signal or the stop signal is input.

The output unit 22 outputs the PWM signal to the switching unit 17 and stops output of the PWM signal to the switching unit 17, in accordance with instructions of the control unit 25. Duty information indicating a duty is stored in the output unit 22. The signal duty of the PWM signal that is output to the switching unit 17 by the output unit 22 is the duty indicated by the duty information. The control unit 25 adjusts the signal duty of the PWM signal, by changing the duty indicated by the duty information.

If the duty indicated by the duty information is changed by the control unit 25 while the output unit 22 is outputting the PWM signal, the signal duty of the PWM signal is also changed.

The storage unit 24 is a nonvolatile memory, for example. A computer program P1 is stored in the storage unit 24. The control unit 25 has a CPU (Central Processing Unit), and the CPU of the control unit 25 executes feed start processing, feed stop processing and duty adjustment processing, by executing the computer program P1. The feed start processing involves causing the output unit 22 to output the PWM signal to the switching unit 17, and starting power feeding to the load 13. The feed stop processing involves causing the output unit 22 to stop output of the PWM signal, and stopping power feeding to the load 13. The duty adjustment processing involves adjusting the signal duty of the PWM signal. The computer program P1 is used in order to cause the CPU of the control unit 25 to execute the feed start processing, the feed stop processing, and the duty adjustment processing.

Note that the computer program P1 may be stored in a storage medium A1 in a manner readable by the CPU of the control unit 25. In this case, the computer program P1 read out from the storage medium A1 by a readout device (not shown) is stored in the storage unit 24. The storage medium A1 is an optical disk, a flexible disk, a magnetic disk, a magnetic optical disk, a semiconductor memory, or the like. The optical disk is a CD-ROM (Compact Disc-Read Only Memory), a DVD-ROM (Digital Versatile Disc-Read Only Memory), or a BD (Blu-ray (registered trademark) Disc). The magnetic disk is a hard disk, for example. Also, the computer program P1 may be downloaded from an external device (not shown) that is connected to a communication network (not shown), and the downloaded computer program P1 may be stored in the storage unit 24.

The control unit 25 performs the feed start processing, when the feed signal is input to the second input unit 21. In the feed start processing, the control unit 25 instructs the output unit 22 to output the PWM signal output to the switching unit 17. The switching unit 17 thereby alternately switches the feed switch 12 to ON and OFF. As a result, power is fed to the load 13 from the generator 10 or the battery 11, and the load 13 operates. The control unit 25 ends the feed start processing, after causing the output unit 22 to output the PWM signal.

The control unit 25 performs the feed stop processing, when the stop signal is input to the second input unit 21. In the feed stop processing, the control unit 25 instructs the output unit 22 to stop output of the PWM signal. The switching unit 17 thereby maintains the feed switch 12 at OFF. As a result, power feeding to the load 13 stops, and the load 13 stops operating. The control unit 25 ends the feed stop processing, after causing the output unit 22 to stop output of the PWM signal.

Figure 2:
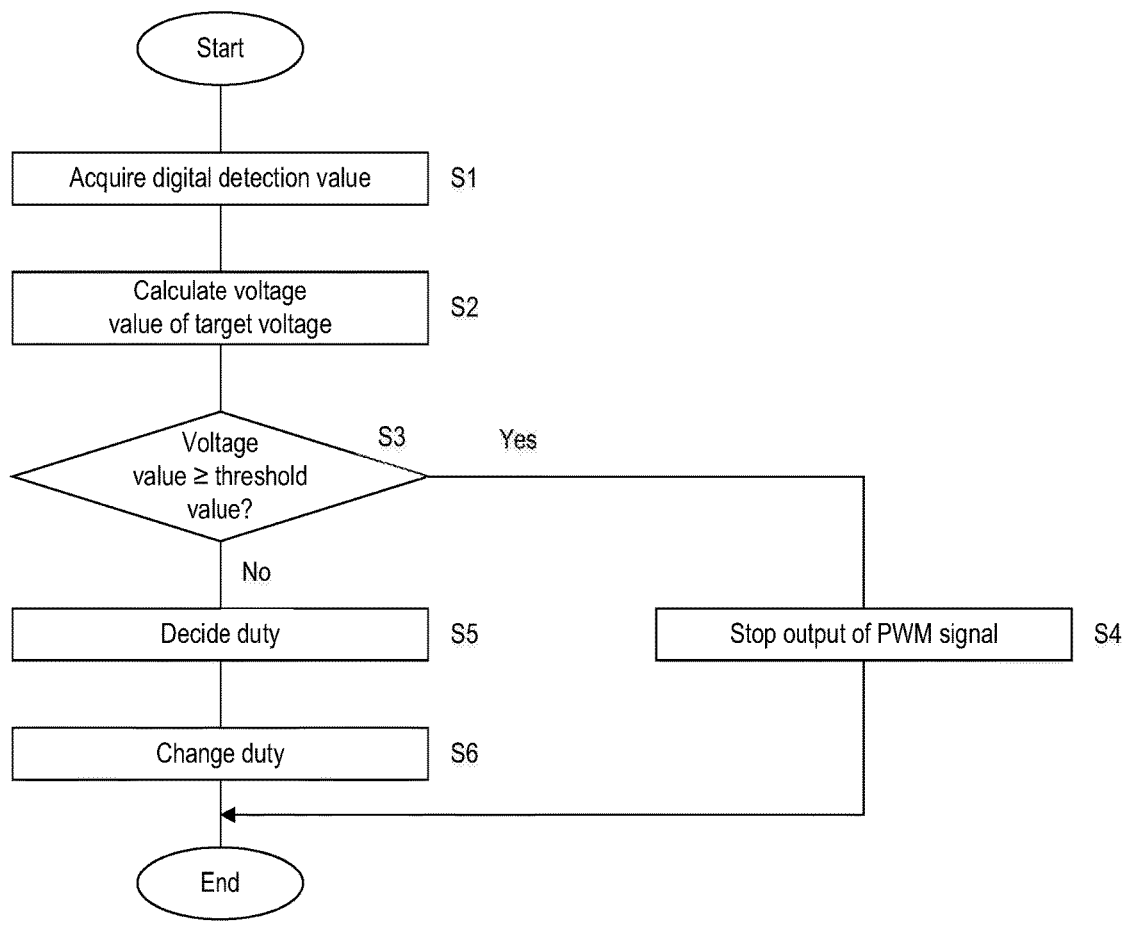
FIG. 2 is a flowchart showing the procedure of duty adjustment processing.

FIG. 2 is a flowchart showing the procedure of the duty adjustment processing. The control unit 25 executes the duty adjustment processing periodically, during the period until the feed stop processing is started after the feed start processing ends.

In the duty adjustment processing, first, the control unit 25 acquires a digital detection value from the A/D conversion unit 23 (step S1), and calculates the voltage value of the target voltage based on the acquired digital detection value (step S2).

Next, the control unit 25 determines whether the voltage value calculated in step S2 is greater than or equal to a threshold value (step S3). The threshold value is a fixed value, and is set in advance. The control unit 25, in the case where it is determined that the voltage value calculated in step S2 is greater than or equal to the threshold value (S3: YES), instructs the output unit 22 to stop output of the PWM signal (step S4). Because the switching unit 17 thereby maintains the feed switch 12 at OFF, the target voltage stops being applied to the load 13.

As described above, the target voltage stops being applied to the load 13 when the voltage value of the target voltage is greater than or equal to the threshold value, and thus an overvoltage is not applied to the load 13. For example, application of an overvoltage whose voltage value is 20 V or more is prevented by setting the threshold value to 18 V.

The control unit 25 ends the duty adjustment processing, after executing step S4. Thereafter, the control unit 25 does not execute the duty adjustment processing, until a predetermined condition is met. The predetermined condition is, for example, that the stop signal and the feed signal are sequentially input to the second input unit 21, and the resumed feed start processing ends.

The control unit 25, in the case where it is determined that the voltage value calculated in step S2 is less than the threshold value (S3: NO), decides the duty, based on the voltage value calculated in step S2 (step S5). Thereafter, the control unit 25 changes the duty of the duty information to the duty decided in step S5 (step S6). The signal duty of the PWM signal and the switching duty related to switching of the feed switch 12 to ON and OFF are thereby adjusted to the duty decided by the control unit 25 in step S5.

The control unit 25 ends the duty adjustment processing, after executing step S6. In this case, the duty adjustment processing is executed again, unless the feed stop processing is started.

The voltage value of the target voltage fluctuates due to various factors. In step S5, the control unit 25 divides the set voltage value that is set in advance by the voltage value calculated in step S2, and calculates the square of the divided value, for example. The control unit 25 decides the duty to be this square. The set voltage value is less than or equal to the lower limit of the fluctuation range of the voltage value of the target voltage. In the case where the duty is decided in this way, the average value of power that is fed to the load 13 is maintained at a substantially constant value, even when the voltage value of the target voltage fluctuates, for example.

As aforementioned, in step S2, the control unit 25 calculates a voltage value based on the digital detection value acquired from the A/D conversion unit 23. The digital detection value is a value that depends on the analog detection value output by the voltage detector 15. Accordingly, the control unit 25 functions as an adjustment unit that adjusts the signal duty of the PWM signal that is output by the output unit 22, according to the analog detection value output by the voltage detector 15.

The voltage detector 15 and the MICOM 16 function as a signal output device.

As aforementioned, the intensity of light that is emitted by an incandescent lamp is dependent on the average value of power that is fed to the incandescent lamp. Thus, in the case where the load 13 is an incandescent lamp, the intensity of light that is emitted by the incandescent lamp is substantially constant even if the voltage value of the target voltage fluctuates, and there is hardly any flickering of the incandescent lamp.

The fluctuation range of the average value of power that is fed to the load 13 is smaller as the voltage value of the target voltage indicated by the digital detection value acquired in step S1, that is, the voltage value that is calculated in step S2, is closer to the actual voltage value of the target voltage. In this case, when the load 13 is an incandescent lamp, the fluctuation in the intensity of light that is emitted by the incandescent lamp is also small. Accordingly, the error between the voltage value of the target voltage indicated by the digital detection value that is acquired from the A/D conversion unit 23 and the actual voltage value of the target voltage is preferably small.

As aforementioned, in the input range of detection values that can be input to the first input unit 20, N digital voltage values are set at equal intervals. A value that is calculated by converting the width of one scale thereof into a width of the voltage value related to detection of the target voltage is the resolution related to the voltage detection. The maximum value of the error between the voltage value of the target voltage indicated by the digital detection value that is acquired from the A/D conversion unit 23 and the actual voltage value of the target voltage is smaller as the resolution is smaller.

In the power supply system 1, the voltage detector 15 has a unique configuration, thus enabling a small resolution to be realized. Hereinafter, the voltage detector 15 will be described.

Figure 3:
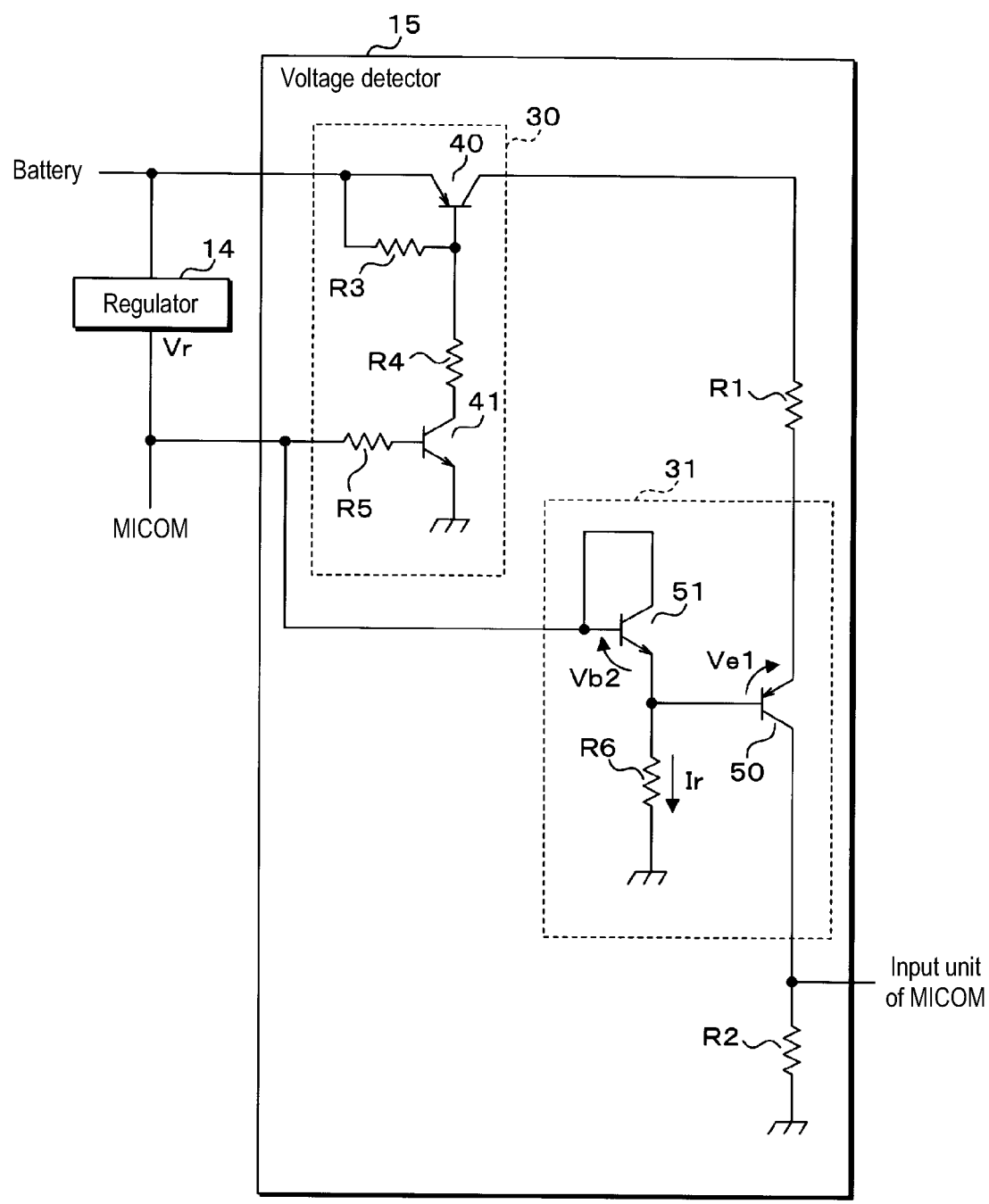
FIG. 3 is a circuit diagram of a voltage detector.

FIG. 3 is a circuit diagram of the voltage detector 15. The voltage detector 15 has a suppression circuit 30, an output circuit 31, and resistors R1 and R2. The suppression circuit 30 has a first switch 40, a second switch 41, and resistors R3, RA and R5. The output circuit 31 has a first transistor 50, a second transistor 51, and a resistor R6. The first switch 40 and the first transistor 50 are both PNP bipolar transistors. The second switch 41 and the second transistor 51 are both NPN bipolar transistors.

In relation to the suppression circuit 30, the emitter of the first switch 40 and one end of the resistor R3 are connected to the positive electrode of the battery 11. A collector of the first switch 40 is connected to one end of the resistor R1. A base of the first switch 40 is connected to the other end of the resistor R3 and one end of the resistor R4. The other end of the resistor RA is connected to a collector of the second switch 41. An emitter of the second switch 41 is grounded. A base of the second switch 41 is connected to one end of the resistor R5. The other end of the resistor R5 is connected to the output end of the regulator 14.

In relation to the output circuit 31, an emitter of the first transistor 50 is connected to the other end of the resistor R1. The collector of the first transistor 50 is connected to one end of the resistor R2. A base of the first transistor 50 is connected to an emitter of the second transistor 51. A base of the second transistor 51 is connected to the output end of the regulator 14 and a collector of the second transistor 51. One end of the resistor R6 is further connected to the emitter of the second transistor 51. The other end of the resistor R6 is grounded. The resistor R6 functions as a third resistor.

The other end of the resistor R2 is grounded. The one end of the resistor R2 is connected to the second input unit 21 of the MICOM 16.

Operations of the suppression circuit 30 will be described. In relation to the first switch 40, in the case where the voltage value of the base based on the potential of the emitter is less than or equal to a negative fixed voltage value, it is possible for current to flow between the emitter and the collector. At this time, the first switch 40 is ON. In relation to the first switch 40, in the case where the voltage value of the base based on the potential of the emitter exceeds the negative fixed voltage value, current does not flow between the emitter and the collector. At this time, the first switch 40 is OFF.

In relation to the second switch 41, in the case where the voltage value of the base based on the potential of the emitter, that is, ground potential, is greater than or equal to a positive fixed voltage value, it is possible for current to flow between the emitter and the collector. At this time, the second switch 41 is ON. In relation to the second switch 41, in the case where the voltage value of the base based on the potential of the emitter is less than the positive fixed voltage value, current does not flow between the emitter and the collector. At this time, the second switch 41 is OFF.

When the regulator 14 operates, the voltage value of the output end of the regulator 14 is adjusted to the reference voltage value Vr, and a predetermined voltage whose voltage value is the reference voltage value Vr is applied to the base and emitter of the second switch 41. The positive fixed voltage value related to the second switch 41 is lower than the reference voltage value Vr. Thus, when the regulator 14 is operating, the voltage value of the base based on the potential of the emitter is greater than or equal to the positive fixed voltage value in the second switch 41, and thus the second switch 41 is ON.

When the second switch 41 is ON, current flows from the one end of the generator 10 or the positive electrode of the battery 11 in order of the resistors R3 and RA and the second switch 41, and a voltage drop occurs in the resistor R3. At this time, in the first switch 40, the voltage value of the base based on the potential of the emitter is less than or equal to the negative fixed voltage value, and the first switch 40 is ON.

As described above, in the case where a predetermined voltage whose voltage value is the reference voltage value Vr is applied to the base and collector of the second transistor 51 from the output end of the regulator 14, the first switch 40 is ON.

When the first switch 40 is ON, current flows from the one end of the generator 10 or the positive electrode of the battery 11 in order of the first switch 40, the resistor R1, the first transistor 50 of the output circuit 31 and the resistor R2, and the target voltage is applied to the one end of the resistor R1 via the first switch 40. At this time, the voltage value of the one end of the resistor R2 based on ground potential is a voltage value that depends on the voltage value of the target voltage, and is output to the first input unit 20 of the MICOM 16 as the analog detection value. The resistor R1 functions as a first resistor, and the resistor R2 functions as a second resistor.

When the regulator 14 stops operating, the voltage value of the base based on the potential of the emitter is 0 V in the second switch 41, this being less than the positive fixed voltage value, and the second switch 41 is OFF. When the second switch 41 is OFF, current does not flow to the resistors R3 and R4, and thus a voltage drop does not occur in the resistor R3. As a result, when the second switch 41 is OFF, the voltage value of the base based on the potential of the emitter is 0 V in the first switch 40, and is thus is greater than or equal to the negative fixed voltage value, and the first switch 40 is OFF.

As described above, in the case where the predetermined voltage has stopped being applied from the output end of the regulator 14, the first switch 40 is OFF.

When the first switch 40 is OFF, current does not flow to the resistor R1, the first transistor 50 of the output circuit 31 or the resistor R2, and thus the one end of the resistor R2 is 0 V regardless of the voltage value of the target voltage, and the target voltage is not detected by the voltage detector 15.

The load 13 is an electrical device that does not need to be operated when the regulator 14 has stopped operating. Accordingly, when the regulator 14 has stopped operating, the voltage detector 15 does not need to perform voltage detection. In the voltage detector 15, when the regulator 14 has stopped operating, that is, when the predetermined voltage has stopped being applied from the output end of the regulator 14, the first switch 40 of the suppression circuit 30 is OFF, and current does not flow through the resistors R1 and R2. Thus, the power that is consumed by the resistors R1 and R2 is suppressed.

Next, operations of the output circuit 31 will be described. When the first switch 40 of the suppression circuit 30 is ON, current is input to the emitter of the first transistor 50 from the other end of the resistor R1. In the first transistor 50, substantially all of the current input to the emitter from the other end of the resistor R1 is output from the collector. Accordingly, the current value of the current that is input to the emitter of the first transistor 50 from the other end of the resistor R1 and the current value of the current that is output from the collector of the first transistor 50 substantively coincide. The current output from the collector of the first transistor 50 is input to the one end of the resistor R2.

A very small amount of the current input to the emitter from the other end of the resistor R1 is output to the resistor R6 from the base.

Current is input to the collector and base of the second transistor 51 from the output end of the regulator 14. In the second transistor 51, the current input to the collector and base is output to the resistor R6.

Hereinafter, the voltage value of the emitter of the first transistor 50 based on the potential of the base of the first transistor 50 will be described as an emitter voltage value Ve1, and the voltage value of the base of the second transistor 51 based on the potential of the emitter of the second transistor 51 will be described as a base voltage value Vb2. Further, the current value of the current that flows through the resistor R6 will be described as a resistor current value Ir.

The first switch 40 is assumed to be ON. When current flows through the first switch 40, the width of the voltage drop that occurs in the first switch 40 is extremely small. Thus, hereinafter, the width of the voltage drop that occurs in the first switch 40 when current flows through the first switch 40 will be regarded as 0 V.

The voltage value of the other end of the resistor R1 based on ground potential is represented by $(Vr-Vb2+Ve1)$. Accordingly, in the case where the voltage value of the target voltage is represented by Va and the resistance value of the resistor R1 is represented by r1, the current value of the current that is input to the emitter of the first transistor 50 from the resistor R1 is represented by $(Va-(Vr-Vb2+Ve1))/r1$. As aforementioned, in the first transistor 50, substantially all of the current input from the other end of the resistor R1 is output to the one end of the resistor R2 from the collector. Accordingly, in the case where the resistance value of the resistor R2 is represented by r2, the voltage value between both ends of the resistor R2 is represented by $(Va-(Vr-Vb2+Ve1))\cdot r2/r1$. If $(Va-(Vr-Vb2+Ve1))$ is negative, the voltage value between both ends of the resistor R2 is 0 V, and the voltage value of the target voltage is not detected.

Figure 4:
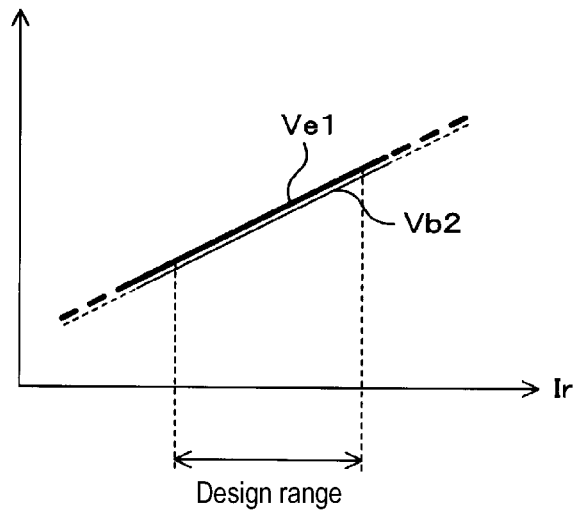
FIG. 4 is an illustrative diagram of the characteristics of a first transistor and a second transistor.

FIG. 4 is an illustrative diagram of the characteristics of the first transistor 50 and the second transistor 51. In FIG. 4, the relationship between the resistor current value Ir and the emitter voltage value Ve1 is shown with a thick line. Also, the relationship between the resistor current value Ir and the base voltage value Vb2 is shown with a thin line. FIG. 4 also shows the design range, which is the fluctuation range of the resistor current value Ir in the case where the voltage value of the target voltage fluctuates in a state where the first switch 40 is ON. For example, in the design of the power supply system 1, in the case where the fluctuation range of the voltage value of the target voltage is from 5 V to 25 V, the design range is the fluctuation range of the resistor current value Ir when the voltage value of the target voltage fluctuates in this range.

As shown in FIG. 4, in the case where the resistor current value Ir is within the design range, the emitter voltage value Ve1 substantially coincides with the base voltage value Vb2. Accordingly, in the case where the resistor current value Ir is in the design range, (Ve1−Vb2) is substantially 0 V, and thus the first transistor 50 maintains the voltage value of the other end of the resistor R1 based on ground potential substantively at the reference voltage value Vr.

As described above, the first transistor 50 of the output circuit 31 outputs a current whose current value substantively coincides with the current value of the current input from the resistor R1 to the resistor R2, while maintaining the voltage value of the other end of the resistor R1 substantively at the reference voltage value Vr.

In the case where the resistor current value Ir is within the design range, the voltage value between both ends of the resistor R2, that is, the analog detection value that is output to the first input unit 20 of the MICOM 16 from the one end of the resistor R2, is represented by ((Va−Vr)·r2/r1). The fluctuation range of the analog detection value needs to be included in the input range. The resistors r1 and r2 are set such that the fluctuation range of the analog detection value is included in the input range.

Assume that the fluctuation range of the voltage value of the target voltage is from 5 V to 25 V, the reference voltage value Vr is 5 V, and the input range is from 0 V to 5 V. In this case, (Va−Vr) fluctuates in a range from 0 V to 20 V. In the case where r2/r1 is ¼, the fluctuation range of the analog detection value is from 0 V to 5 V, and is included in the input range.

Note that, in step S2 of the duty adjustment processing, the control unit 25 calculates a voltage value Va of the target voltage, by substituting a digital detection value Vs acquired in step S1 into (Vs·r1/r2)+Vr).

Figure 5:
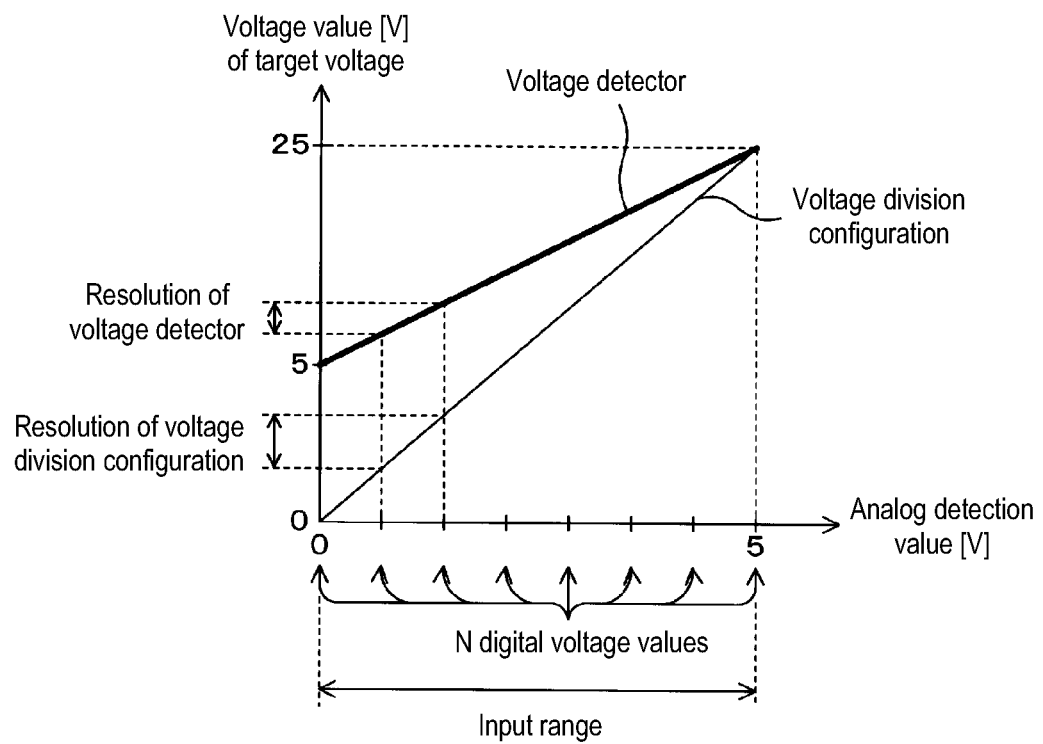
FIG. 5 is an illustrative diagram of the effects of the voltage detector.

FIG. 5 is an illustrative diagram of the effects of the voltage detector 15. In FIG. 5, in relation to the voltage detector 15, the relationship between the analog detection value (Va−Vr)·r2/r1 and the voltage value Va of the target voltage is shown with a thick line. The setting condition is that the fluctuation range of the voltage value of the target voltage is from 5 V to 25 V, the reference voltage value Vr is 5 V, the input range is from 0 V to 5 V, and r2/r1 is ¼. So as to facilitate understanding of the effects of the voltage detector 15, the number of digital voltage values N is assumed to be 2 to the power of 3, that is, 8.

As aforementioned, the analog detection value is converted into one of the N (=8) digital voltage values arranged at equal intervals in the input range. The resolution related to the voltage detector 15 is calculated, by converting one scale related to the N digital voltage values into the width of the voltage value related to detection of the target voltage. The resolution of the voltage detector 15 is calculated by dividing the width of the fluctuation range related to the voltage value of the target voltage by (N−1), and is 2.86 V in the example of FIG. 5.

As a conventional configuration for performing voltage detection, a voltage division configuration for dividing the target voltage is conceivable. In a voltage division configuration, two resistors are provided, with one end of one resistor being connected to the positive electrode of the battery 11, the other end of the one resistor being connected to one end of the other resistor, and the other end of the other resistor being grounded. The two resistors divide the target voltage, and output the voltage value of the divided voltage to the first input unit 20 of the MICOM 16 from the other end of the one resistor as the analog detection value.

In the case where the resistance value of the one resistor is represented by ra and the resistance value of the other resistor is represented by rb, the analog detection value is represented by Va·rb/(ra+rb). In the voltage division configuration, the resistance values ra and rb are set such that the fluctuation range of the analog detection value is included in the input range. Specifically, the voltage value Va of the target voltage fluctuates in a range from 0 V to 25 V. Thus, in the case where rb/(ra+rb) is ⅕, the fluctuation range of the analog detection value is from 0 V to 5 V, and is included in the input range.

In FIG. 5, in relation to the voltage division configuration, the relationship between the analog detection value Va·rb/(ra+rb) and the voltage value Va of the target voltage is shown with a thin line. The resolution of the voltage division configuration is calculated by dividing the upper limit of the fluctuation range related to the voltage value of the target voltage by (N−1), and is 3.57 V in the example of FIG. 5.

As aforementioned, the A/D conversion unit 23 selects one of the N digital voltage values as the digital detection value, based on the analog detection value. Thus, the error between the analog detection value and the digital detection value is smaller, and the error between the voltage value of the target voltage indicated by the digital detection value and the actual voltage value of the target voltage is smaller, as the resolution is smaller.

As shown in FIG. 5, with the voltage detector 15, the lower limit of the target voltage detection range can be adjusted to a voltage value exceeding 0 V, by adjusting the reference voltage value Vr to a voltage value exceeding 0 V. The lower limit of the detection range of the voltage division configuration is always 0 V. As a result, the slope of a graph related to the voltage detector 15 is smaller than the slope of a graph related to resolution, and the resolution of the voltage detector 15 is small.

Note that, in the case where the resistor current value Ir is within the design range, the emitter voltage value Ve1 and the base voltage value Vb2 need not substantially coincide. For example, in the case where the resistor current value Ir is within the design range, a difference voltage value Vd that is calculated by subtracting the base voltage value Vb2 from the emitter voltage value Ve1 may be substantially constant. This first transistor 50 maintains the voltage value of the other end of the resistor R1 at (Vr+Vd). (Vr+Vd) is substantially constant. Even in this case, the resolution related to the voltage detector 15 is small. The analog detection value is represented by ((Va−Vr−Vd)·r2/r1). In step S2 of the duty adjustment processing, the control unit 25 calculates the voltage value of the target voltage, by substituting the digital detection value Vs acquired in step S1 into (Vs·r1/r2)+Vr+Vd).

Also, in relation to the suppression circuit 30, the first switch 40 is not limited to a PNP bipolar transistor, and may, for example, be a P-channel FET (Field Effect Transistor). Further, the second switch 41 is not limited to an NPN bipolar transistor, and may, for example, be an N-channel FET. The collector, emitter and base of a bipolar transistor respectively correspond to drain, source and gate of a FET.

Second Embodiment

Figure 6:
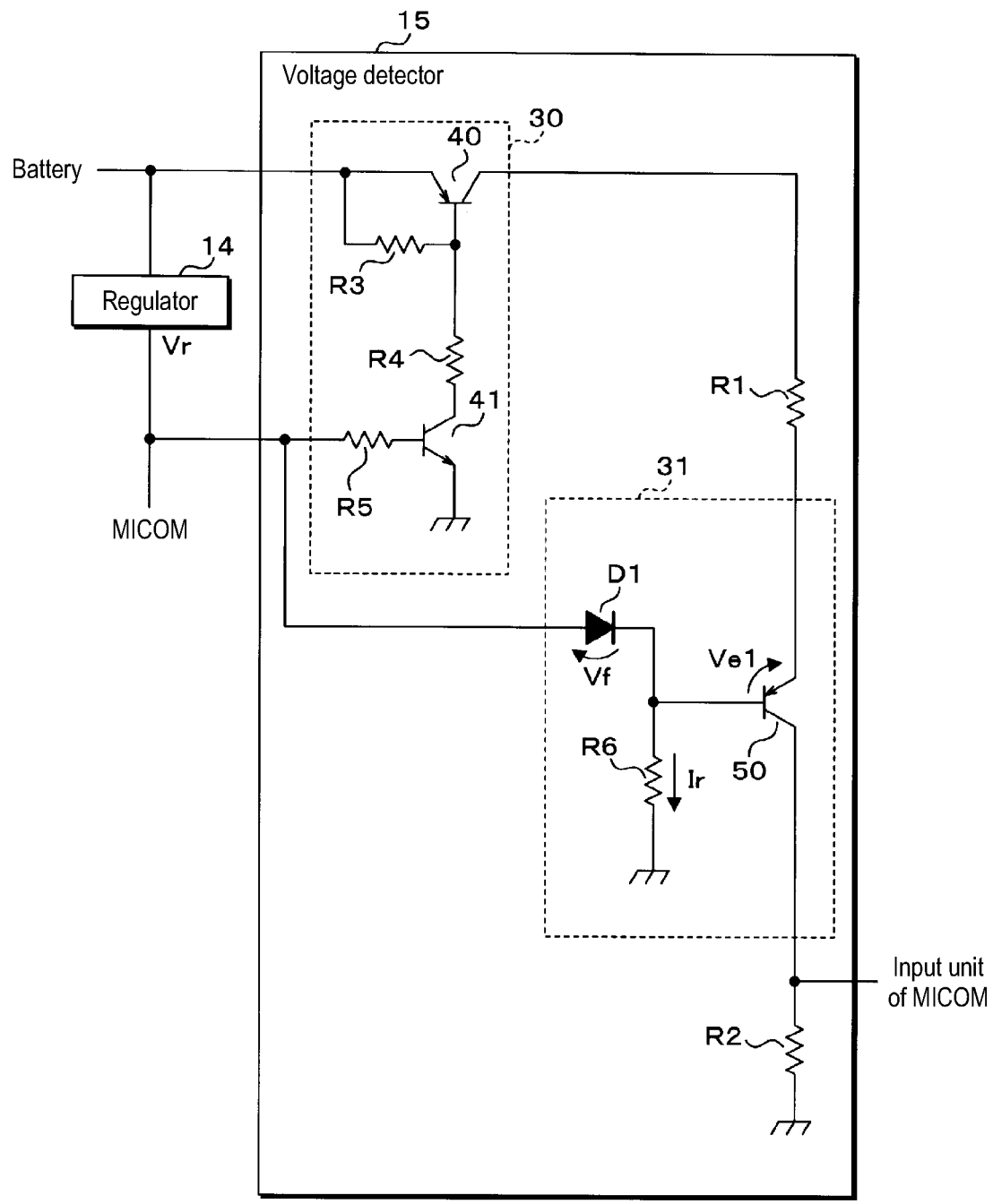
FIG. 6 is a circuit diagram of a voltage detector in a second embodiment.

FIG. 6 is a circuit diagram of the voltage detector 15 in a second embodiment.

Hereinafter, points that differ from the first embodiment will be described in regard to the second embodiment. Since the remaining configuration excluding the configuration that will be described below is in common with the first embodiment, the same reference signs as the first embodiment will be given to components that are in common with the first embodiment, and description thereof will be omitted.

The power supply system 1 of the second embodiment, when compared with the power supply system 1 in the first embodiment, differs in the configuration of the voltage detector 15.

The output circuit 31 in the second embodiment has a first transistor 50 and a resistor R6, similarly to the first embodiment. The output circuit 31 in the second embodiment further has a diode D1.

The emitter of the first transistor 50 is connected to the other end of the resistor R1. The collector of the first transistor 50 is connected to the one end of the resistor R2. The base of the first transistor 50 is connected to a cathode of the diode D1. The output end of the regulator 14 is connected to an anode of the diode D1. A predetermined voltage whose voltage value is the reference voltage value Vr is applied to the anode of the diode D1 from the output end of the regulator 14. The one end of the resistor R6 is connected to the cathode of the diode D1. The other end of the resistor R6 is grounded.

In the suppression circuit 30, similarly to the first embodiment, when the predetermined voltage is being applied from the output end of the regulator 14, the first switch 40 is ON, and when the predetermined voltage has stopped being applied from the output end of the regulator 14, the first switch 40 is OFF.

In the output circuit 31, when the first switch 40 of the suppression circuit 30 is ON, current is input to the emitter of the first transistor 50 from the other end of the resistor R1. In the first transistor 50, substantively all of the current input to the emitter from the other end of the resistor R1 is output from the collector. Accordingly, the current value of the current that is input to the emitter of the first transistor 50 from the other end of the resistor R1 and the current value of the current that is output from the collector of the first transistor 50 substantively coincide. The current output from the collector of the first transistor 50 is input to the one end of the resistor R2.

A very small amount of the current input to the emitter from the other end of the resistor R1 is output to the resistor R6 from the base.

Also, current is input to the anode of the diode D1 from the output end of the regulator 14. The current input to the anode of the diode D1 is output to the resistor R6 from the cathode of the diode D1.

Hereinafter, the forward voltage value of the diode D1 in the case where current flows through the diode D1, that is, the voltage value of the anode based on the potential of the cathode in the diode D1, will be described as a diode voltage value Vf. Similarly to the first embodiment, the width of the voltage drop that occurs in the first switch 40 when current flows through the first switch 40 is regarded as 0 V. The current value of the current that is input to the emitter of the first transistor 50 from the resistor R1 is represented by (Va−(Vr−Vf+Ve1))/r1.

As aforementioned, in the first transistor 50, substantially all of the current input from the other end of the resistor R1 is output to the one end of the resistor R2 from the collector. Accordingly, the voltage value between both ends of the resistor R2 is represented by (Va−(Vr−Vf+Ve1))·r2/r1. In the case where (Va−(Vr−Vf+Ve1)) is negative, the voltage value between both ends of the resistor R2 is 0 V, and the voltage value of the target voltage is not detected.

The relationship between the emitter voltage value Ve1 and the diode voltage value Vf is similar to the relationship between the emitter voltage value Ve1 and the base voltage value Vb2 described in the first embodiment. Accordingly, when the resistor current value Ir is within the design range, the emitter voltage value Ve1 substantially coincides with the diode voltage value Vf, or the difference voltage value Vt that is calculated by subtracting the diode voltage value Vf from the emitter voltage value Ve1 is substantially constant.

The power supply system 1 and the voltage detector 15 in the second embodiment constituted as described above also achieve similar effects to the first embodiment.

When the emitter voltage value Ve1 substantially coincides with the diode voltage value Vf, the analog detection value that is output from the one end of the resistor R6 is represented by (Va−Vr)·r2/r1, similarly to the first embodiment, and the voltage value of the other end of the resistor R1 is maintained substantively at the reference voltage value Vr.

When the difference voltage value Vt is substantially constant, the analog detection value that is output from the one end of the resistor R6 is represented by (Va−Vr−Vt)·r2/r1, and the voltage value of the other end of the resistor R1 is maintained at (Vr+Vt). (Vr+Vt) is substantially constant.

Third Embodiment

Figure 7:
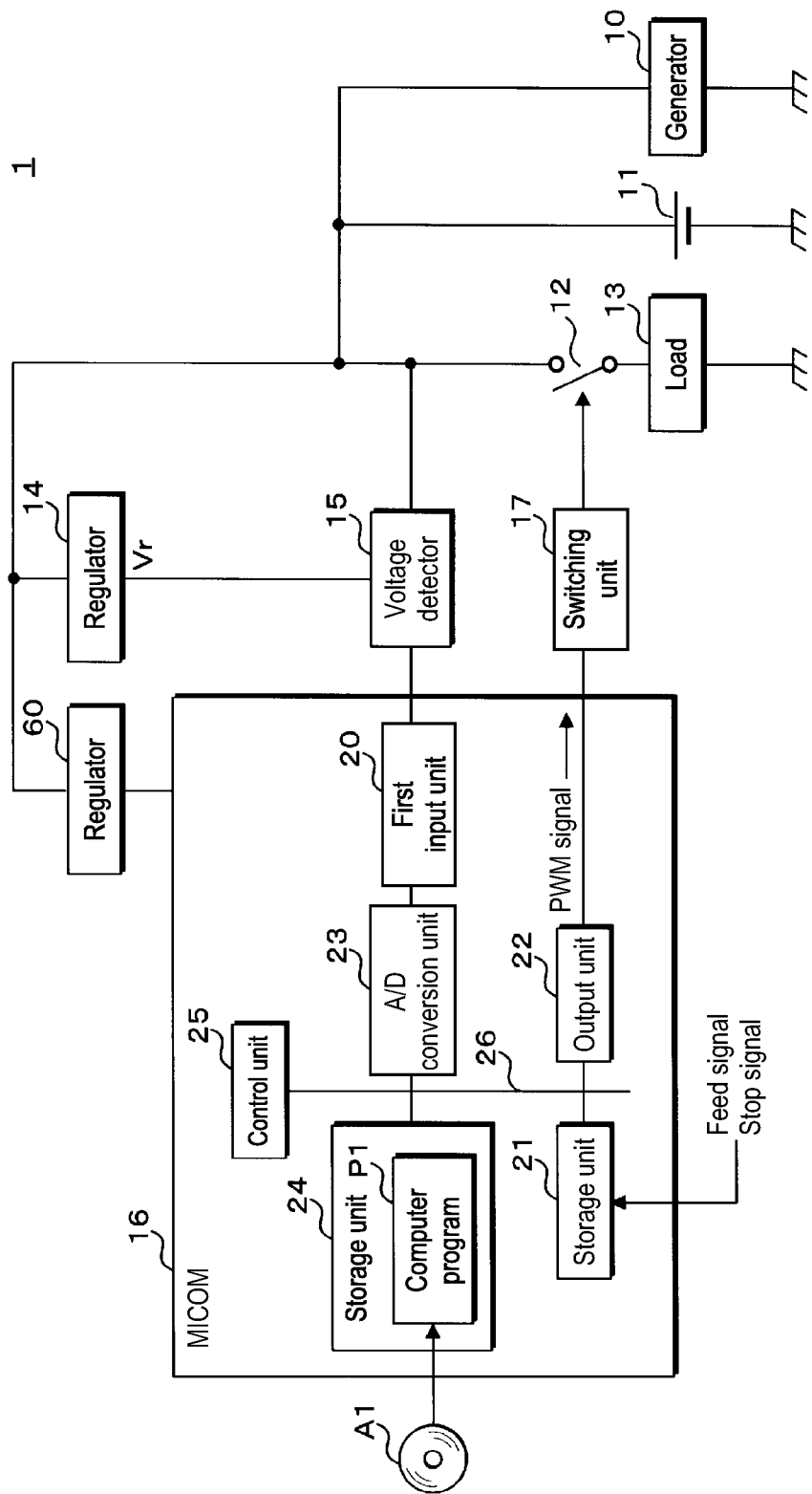
FIG. 7 is a block diagram showing the configuration of a main section of a power supply system in a third embodiment.

FIG. 7 is a block diagram showing the configuration of a main section of the power supply system 1 in a third embodiment.

Hereinafter, points that differ from the first embodiment will be described in regard to the third embodiment. Since the remaining configuration excluding the configuration that will be described below is in common with the first embodiment, the same reference signs as the first embodiment will be given to components that are in common with the first embodiment, and description thereof will be omitted.

The power supply system 1 in the third embodiment further has a regulator 60, in addition to the components with which the power supply system 1 in the first embodiment is provided. The regulator 60 has an input end and an output end similarly to the regulator 14. The input end of the regulators 14 and 60 is connected to one end of the feed switch 12. The output end of the regulator 14 is connected to the other end of the resistor R5 and the base and collector of the second transistor 51 in the voltage detector 15. The output end of the regulator 60 is connected to the MICOM 16.

The regulator 60 generates a voltage whose voltage value is a second reference voltage value, using the voltage being input to the input end, and outputs the generated voltage to the MICOM 16 from the output end. The second reference voltage value is constant, and is set in advance.

When the regulator 60 is outputting the voltage whose voltage value is the second reference voltage value from the output end, the MICOM 16 is operating. When the regulator 60 has stopped outputting a voltage, the MICOM 16 is stops operating. The regulator 60, similarly to the regulator 14, operates when an ignition switch of the vehicle switches from OFF to ON, and stops operating when the ignition switch switches from ON to OFF, for example.

In the power supply system 1 of the third embodiment constituted as described above, the voltage value of the voltage that is output to the MICOM 16 and the voltage value of the voltage that is output to the voltage detector 15 can be adjusted separately. For example, the reference voltage value Vr can be set to 10 V, and the second reference voltage value can be set to 5 V. The power supply system 1 and voltage detector 15 in the third embodiment respectively also achieve similar effects to the effects that are achieved by the power supply system 1 and the voltage detector 15 in the first embodiment.

Note that, in the third embodiment, the voltage detector 15 may be constituted similarly to the second embodiment. In this case, the output end of the regulator 14 is connected to the other end of the resistor R5 and the anode of the diode D1 in the voltage detector 15. Even in the case where the voltage detector 15 is constituted similarly to the second embodiment, the power supply system 1 and the voltage detector 15 respectively achieve similar effects to the effects described in the third embodiment.

The disclosed first to third embodiments are considered in all respects to be illustrative and not restrictive. The scope of the disclosure is indicated by the claims rather than the foregoing description, and all changes that come within the meaning and range of equivalency of the claims are intended to be embraced therein.

The invention claimed is:

1. A voltage detector for detecting a target voltage and outputting a detection value indicating a detected voltage value, the voltage detector comprising:
   a first resistor to which the target voltage to be detected is applied at a first end;
   an output circuit to which a current is input from a second end of the first resistor, the second end opposite the first end, and configured to output a current whose current value coincides with a current value of the current input from the second end of the first resistor; and a second resistor to which the current output by the output circuit is input at one end; and wherein the output circuit includes:
      a PNP first bipolar transistor whose emitter is connected to the second end of the first resistor, and whose collector is connected to the one end of the second resistor;
      an NPN second bipolar transistor to which a base of the first bipolar transistor is connected at an emitter, and to which a second predetermined voltage is applied at a base; and
      a third resistor whose one end is connected to the emitter of the second bipolar transistor, and
      the base of the second bipolar transistor is connected to a collector of the second bipolar transistor; and
   wherein the output circuit maintains a voltage value of the second end of the first resistor at a predetermined voltage value, and outputs a voltage value of the one end of the second resistor as the detection value.

2. The voltage detector according to claim 1, comprising:
   a switch whose one end is connected to the first end of the first resistor,
   wherein the target voltage is applied to the first end of the first resistor via the switch, and
   the switch is ON when the second predetermined voltage is being applied, and is OFF when the second predetermined voltage has stopped being applied.

3. A voltage detector for detecting a target voltage and outputting a detection value indicating a detected voltage value, the voltage detector comprising:
   a first resistor to which the target voltage to be detected is applied at a first end;
   an output circuit to which a current is input from a second end of the first resistor, the second end opposite the first end, and configured to output a current whose current value coincides with a current value of the current input from the second end of the first resistor; and a second resistor to which the current output by the output circuit is input at one end; and wherein the output circuit includes:
      a PNP bipolar transistor whose emitter is connected to the second end of the first resistor, and whose collector is connected to the one end of the second resistor;
      a diode to which a base of the bipolar transistor is connected at a cathode, and to which a second predetermined voltage is applied at an anode, and
      a third resistor whose one end is connected to the cathode of the diode; and
   wherein the output circuit maintains a voltage value of the second end of the first resistor at a predetermined voltage value, and outputs a voltage value of the one end of the second resistor as the detection value.

4. The voltage detector according to claim 3, further comprising:
   a switch whose one end is connected to the first end of the first resistor,
   wherein the target voltage is applied to the first end of the first resistor via the switch, and
   the switch is ON when the second predetermined voltage is being applied, and is OFF when the second predetermined voltage has stopped being applied.

5. A signal output device comprising:
   a voltage detector for detecting a target voltage and outputting a detection value indicating a detected voltage value, the voltage detector comprising:
   a first resistor to which the target voltage to be detected is applied at a first end;
   an output circuit to which a current is input from a second end of the first resistor, the second end opposite of the first end, and configured to output a current whose current value coincides with a current value of the current input from the second end of the first resistor; and a second resistor to which the current output by the output circuit is input at one end; and wherein the output circuit includes:
      a PNP first bipolar transistor whose emitter is connected to the second end of the first resistor, and whose collector is connected to the one end of the second resistor;
      an NPN second bipolar transistor to which a base of the first bipolar transistor is connected at an emitter, and to which a second predetermined voltage is applied at a base; and
      a third resistor whose one end is connected to the emitter of the second bipolar transistor, and
      the base of the second bipolar transistor is connected to a collector of the second bipolar transistor; and wherein the output circuit maintains a voltage value of the second end of the first resistor at a predetermined voltage value, and outputs a voltage value of the one end of the second resistor as the detection value; and an output unit configured to output a PWM signal; and an adjustment unit configured to adjust a duty of the PWM signal that is output by the output unit, according to the detection value output by the voltage detector.

6. The signal output device set forth in claim 5, further comprising:

a switch whose one end is connected to the first end of the first resistor, wherein the target voltage is applied to the first end of the first resistor via the switch, and the switch is ON when the second predetermined voltage is being applied, and is OFF when the second predetermined voltage has stopped being applied.

7. A signal output device comprising:

a voltage detector for detecting a target voltage and outputting a detection value indicating a detected voltage value, the voltage detector comprising:

a first resistor to which the target voltage to be detected is applied at a first end;

an output circuit to which a current is input from a second end of the first resistor, the second end opposite of the first end, and configured to output a current whose current value coincides with a current value of the current input from the second end of the first resistor;

and a second resistor to which the current output by the output circuit is input at one end; and wherein the output circuit includes:

a PNP bipolar transistor whose emitter is connected to the second end of the first resistor, and whose collector is connected to the one end of the second resistor;

a diode to which a base of the bipolar transistor is connected at a cathode, and to which a second predetermined voltage is applied at an anode, and a third resistor whose one end is connected to the cathode of the diode; and wherein the output circuit maintains a voltage value of the second end of the first resistor at a predetermined voltage value, and outputs a voltage value of the one end of the second resistor as the detection value; and an output unit configured to output a PWM signal; and an adjustment unit configured to adjust a duty of the PWM signal that is output by the output unit, according to the detection value output by the voltage detector.

8. The signal output device set forth in claim 7, further comprising:

a switch whose one end is connected to the first end of the first resistor, wherein the target voltage is applied to the first end of the first resistor via the switch, and the switch is ON when the second predetermined voltage is being applied, and is OFF when the second predetermined voltage has stopped being applied.

* * * * *